(12) United States Patent
Harrison

(10) Patent No.: US 10,715,034 B2
(45) Date of Patent: Jul. 14, 2020

(54) ISOLATED GATE DRIVER AUXILIARY POWER SUPPLY

(71) Applicant: Enphase Energy, Inc., Petaluma, CA (US)

(72) Inventor: Michael J. Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 488 days.

(21) Appl. No.: 15/001,582

(22) Filed: Jan. 20, 2016

(65) Prior Publication Data

US 2016/0211841 A1    Jul. 21, 2016

Related U.S. Application Data

(60) Provisional application No. 62/105,360, filed on Jan. 20, 2015.

(51) Int. Cl.
| | |
|---|---|
| H03B 1/00 | (2006.01) |
| H03K 3/00 | (2006.01) |
| H02M 3/07 | (2006.01) |
| H03K 17/689 | (2006.01) |
| H02M 3/337 | (2006.01) |
| H02M 1/44 | (2007.01) |
| H03K 17/78 | (2006.01) |

(52) U.S. Cl.
CPC ............... *H02M 3/07* (2013.01); *H02M 1/44* (2013.01); *H02M 3/3376* (2013.01); *H03K 17/689* (2013.01); *H03K 17/78* (2013.01); *H03K 2217/0081* (2013.01)

(58) Field of Classification Search
CPC ........................................................ H02M 3/07
USPC ........................................................ 327/109
See application file for complete search history.

(56) References Cited

U.S. PATENT DOCUMENTS

| | | | | |
|---|---|---|---|---|
| 2004/0125623 | A1* | 7/2004 | Sankman | H02M 3/00 363/41 |
| 2004/0207359 | A1* | 10/2004 | Jahkonen | H02M 1/088 318/807 |
| 2009/0315393 | A1* | 12/2009 | Yeh | B60L 1/00 307/10.1 |
| 2014/0049175 | A1* | 2/2014 | Fang | H02M 3/33546 315/205 |
| 2015/0253792 | A1* | 9/2015 | Zolnhofer | G05F 1/563 323/281 |
| 2016/0142049 | A1* | 5/2016 | Richardson | H03K 17/687 327/109 |

OTHER PUBLICATIONS

"PES3.2 Galvanic Isolation for Power Supply Applications", Apec 2013, Long Beach, California, Mar. 18, 2013.
"0.5 and 4.0 AMP Isodrivers (2.5 and 5 KVRMS)", Silicon Laboratories Inc.

* cited by examiner

*Primary Examiner* — Metasebia T Retebo
(74) *Attorney, Agent, or Firm* — Moser Taboada

(57) ABSTRACT

Apparatus and system for powering an isolated gate driver. In one embodiment, the apparatus comprises a gate driver power supply unit (PSU), coupled to a transistor and to an isolated gate driver that couples control signals to the transistor, for (i) harnessing energy from commutation action across the transistor, and (ii) using the harnessed energy to power the isolated gate driver.

20 Claims, 6 Drawing Sheets though the appended drawings illustrate only typical embodiments of this invention and are therefore not to be considered limiting of its scope, for the invention may admit to other equally effective embodiments.

FIG. 1 is a block diagram of a power converter comprising a plurality of gate driver auxiliary power supply units (PSUs) in accordance with one or more embodiments of the present invention;

ISOLATED GATE DRIVER AUXILIARY POWER SUPPLY

CROSS-REFERENCE TO RELATED APPLICATIONS

This application claims benefit of U.S. provisional patent application Ser. No. 62/105,360, entitled "Isolated Gate Driver Auxiliary Power Supply" and filed Jan. 20, 2015, which is herein incorporated in its entirety by reference.

BACKGROUND OF THE INVENTION

Field of the Invention

Embodiments of the present disclosure relate generally to providing power for a gate driver and, more particularly, to an isolated gate driver power supply solution.

Description of the Related Art

A gate driver is a power amplifier that accepts a low-power input and produces the appropriate high-current gate drive for a power transistor such as an insulated-gate bipolar transistor (IGBT) or a power metal-oxide-semiconductor field-effect transistor (MOSFET). Isolated gate drivers provide electrical isolation as well as strong gate drive capability, which is often required for safety and robustness in many system architectures.

Isolated gate driver power supplies required for powering the isolated gate drivers typically have several highly undesirable characteristics, such as creating large amounts of electromagnetic interference (EMI) noise that must be filtered out, having a high inefficiency from a power-usage perspective, and requiring a safety-rated transformer which increases cost and overall circuit size.

Therefore, there is a need in the art for an efficient isolated gate driver power supply solution.

SUMMARY OF THE INVENTION

Embodiments of the present invention generally relate to an apparatus and system for powering an isolated gate driver substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
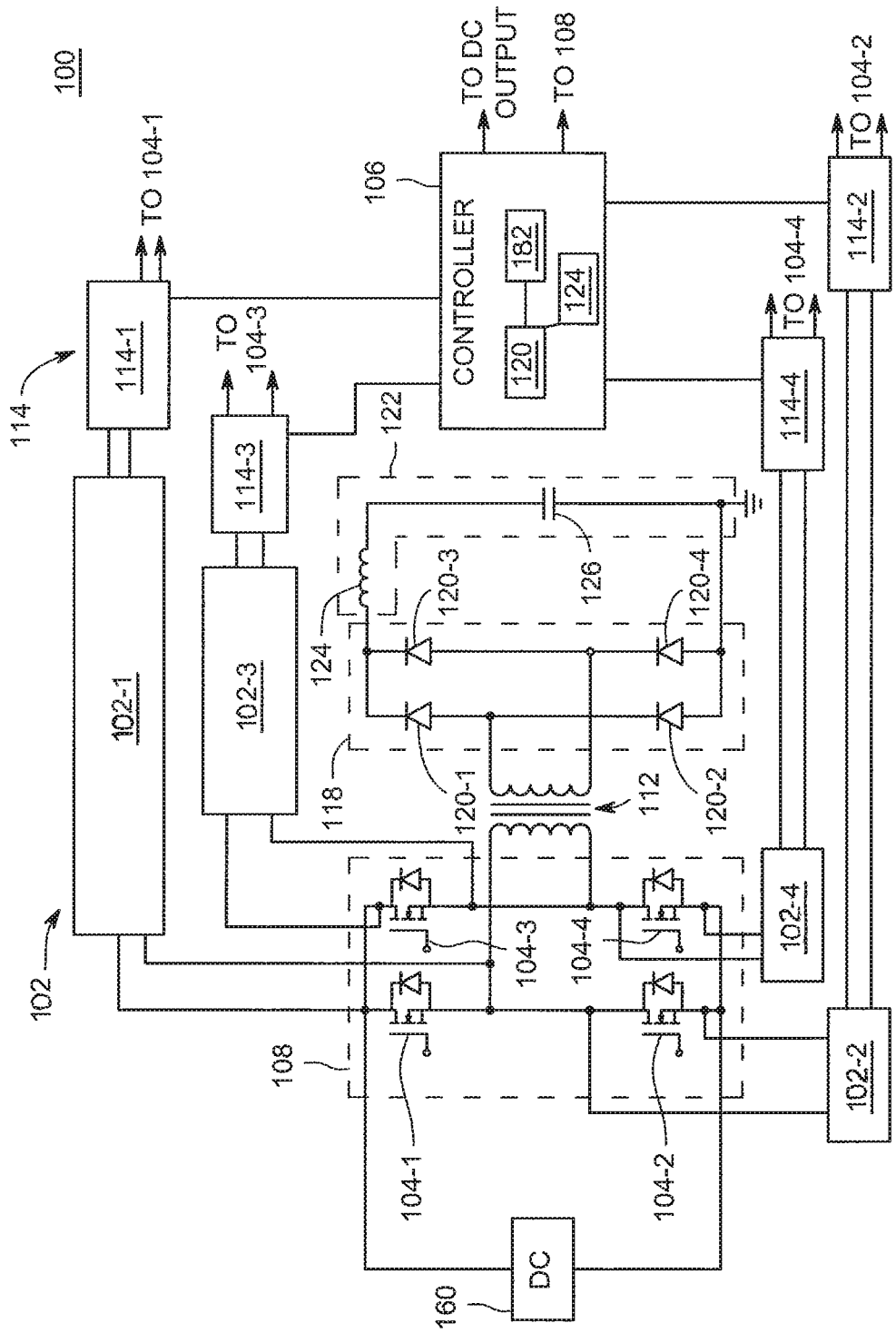
FIG. 1 is a block diagram of a power converter comprising a plurality of gate driver auxiliary power supply units (PSUs) in accordance with one or more embodiments of the present invention.

FIG. 1 is a block diagram of a power converter 100 comprising a plurality of gate driver auxiliary power supply units 102 in accordance with one or more embodiments of the present invention.

The power converter 100 is a DC:DC power converter that converts DC input power to DC output power. The DC input (DC 160) may be from any suitable DC source, e.g., the Power Factor Corrected [PFC] front-end converter on a two-stage isolated AC:DC "off-line" power converter. In some alternative embodiments, the power converter 100 may be part of an inverter coupled to a photovoltaic (PV) module as part of a solar power system, where the inverter comprises a first stage boost converter to perform a maximum power point tracking (MPPT) function followed by a second stage inverter to convert the high-voltage DC into AC commensurate with the mains grid. In some such embodiments where the power converter 100 is part of a DC:AC inverter, the inverter is a bidirectional inverter that can convert DC power to AC power, and can further convert AC power to DC power.

The power converter 100 comprises a DC input bridge 108 coupled to the primary winding of a transformer 112. The secondary winding of the transformer 112 is coupled to a full bridge rectifier circuit 118 that feeds an output filter 122 comprising an output inductor 124 coupled in series with an output capacitor 126.

The DC input bridge 108 comprises switches 104-1, 104-2, 104-3, and 104-4 (collectively referred to as switches 104) coupled in a full H-bridge configuration. As depicted in FIG. 1, the series combination of the switches 104-1, 104-2 is coupled across the series combination of the switches 104-3, 104-4, where the switches 104-1 and 104-4 form a first diagonal of the input bridge 108 and the switches 104-2 and 104-3 form a second diagonal of the input bridge 108. The switches 104 are high-voltage power transistors, such as metal-oxide-semiconductor field-effect transistor (MOSFETs), insulated gate bipolar transistors (IGBTs), or the like. In some alternative embodiments, the DC input bridge 108 is a half-bridge where two of the depicted transistors, such as 104-3 & 104-4, are replaced by two capacitors to form a half-bridge configuration.

The rectifier circuit 118 comprises diodes 120-1, 120-2, 120-3 and 120-4, collectively referred to as diodes 120. The series combination of the diodes 120-1, 120-2 is coupled across the series combination of the diodes 120-3, 120-4. In other embodiments, other types of rectifier circuits may be used in place of the rectifier circuit 118.

The power converter 100 further comprises auxiliary gate driver power supply units (PSU) 102-1, 102-2, 102-3, and 102-4, isolated gate drivers 114-1, 114-2, 114-3, and 114-4, and a controller 106. The auxiliary gate driver PSUs 102-1, 102-2, 102-3, and 102-4, collectively referred to as gate driver PSUs 102 (or simply PSUs 102), are respectively coupled to the isolated gate drivers 114-1, 114-2, 114-3, and 114-4, collectively referred to as isolated gate drivers 114, for providing power to the isolated gate drivers 114 as described further below.

The controller 106 comprises at least one central processing unit (CPU) 120 coupled to each of support circuits 182 and to a memory 124; in some embodiments, the CPU 120 may further be coupled to a transceiver for communication to and from the power converter 100 (e.g., using power line communications). The CPU 120 may comprise one or more processors, microprocessors, microcontrollers and combinations thereof configured to execute non-transient software instructions to perform various tasks, such as determining switching logic for the converter switches. In some embodiments, the CPU 120 may be a microcontroller comprising internal memory for storing controller firmware that, when executed, provides the controller functionality. The CPU 120 may additionally or alternatively include one or more application specific integrated circuits (ASICs). The support circuits 182 are well known circuits used to promote functionality of the CPU 120. Such circuits include, but are not limited to, a cache, power supplies, clock circuits, buses, network cards, input/output (I/O) circuits, and the like. The controller 106 may be implemented using a general purpose computer that, when executing particular software, becomes a specific purpose computer for performing various embodiments of the present invention. The memory 124 may comprise random access memory, read only memory, removable disk memory, flash memory, and various combinations of these types of memory. The memory 124 is sometimes referred to as main memory and may, in part, be used as cache memory or buffer memory. The memory 124 generally stores the operating system (OS) of the controller 106. The OS may be one of a number of commercially available operating systems such as, but not limited to, Linux, Real-Time Operating System (RTOS), and the like. The memory 124 stores non-transient processor-executable instructions and/or data that may be executed by and/or used by the CPU 120. These processor-executable instructions may comprise firmware, software, and the like, or some combination thereof. The memory 124 stores various forms of application software for operating the power converter 100, such as one or more of a maximum power point tracking (MPPT) module, a power conversion control module, a communications module, a synchronization module, a monitoring module, and the like.

The controller 106 is coupled to the DC input bridge 108 for monitoring the DC input current and/or voltage of the power converter 100, and is also coupled to the DC output for monitoring the DC output current and/or voltage of the power converter 100 (e.g., for using during power conversion). The controller 106 is further coupled to the isolated gate drivers 114, and the isolated gate drivers 114 are coupled to the DC input bridge switches 104 for controlling the switches 104 based on control signals received from the controller 106. In some embodiments, the gate driver 114 is an Si823x isolated gate driver by Silicon Labs.

In accordance with one or more embodiments of the present invention, the gate driver PSUs 102-1, 102-2, 102-3, and 102-4 are respectively coupled across the switches 104-1, 104-2, 104-3, and 104-4 in a one-to-one correspondence in order for the PSUs 102 to harness energy directly from the voltage commutation action across the corresponding high-voltage switch 104. The harnessed energy is used to power to the corresponding isolated gate driver 114 for driving the switch 104.

The auxiliary gate driver PSU 102 described herein improves component count/cost and EMI performance over other types of auxiliary gate driver PSUs having a transformer that straddles the primary to secondary isolation barrier and thus becomes a source of EMI noise and also is susceptible to any stray EMI in the power converter providing a path to couple this noise to the mains terminals of the power converter. Although a DC:DC power converter is depicted in FIG. 1, the auxiliary gate driver PSU 102 may be used for providing the power for any isolated gate drivers in any power converter.

As described in detail below, the gate driver PSU 102 is based on a charge pump concept where the normally occurring high frequency AC voltage that occurs across the corresponding transistor switch 104 is used to drive the charge pump.

Figure 2:
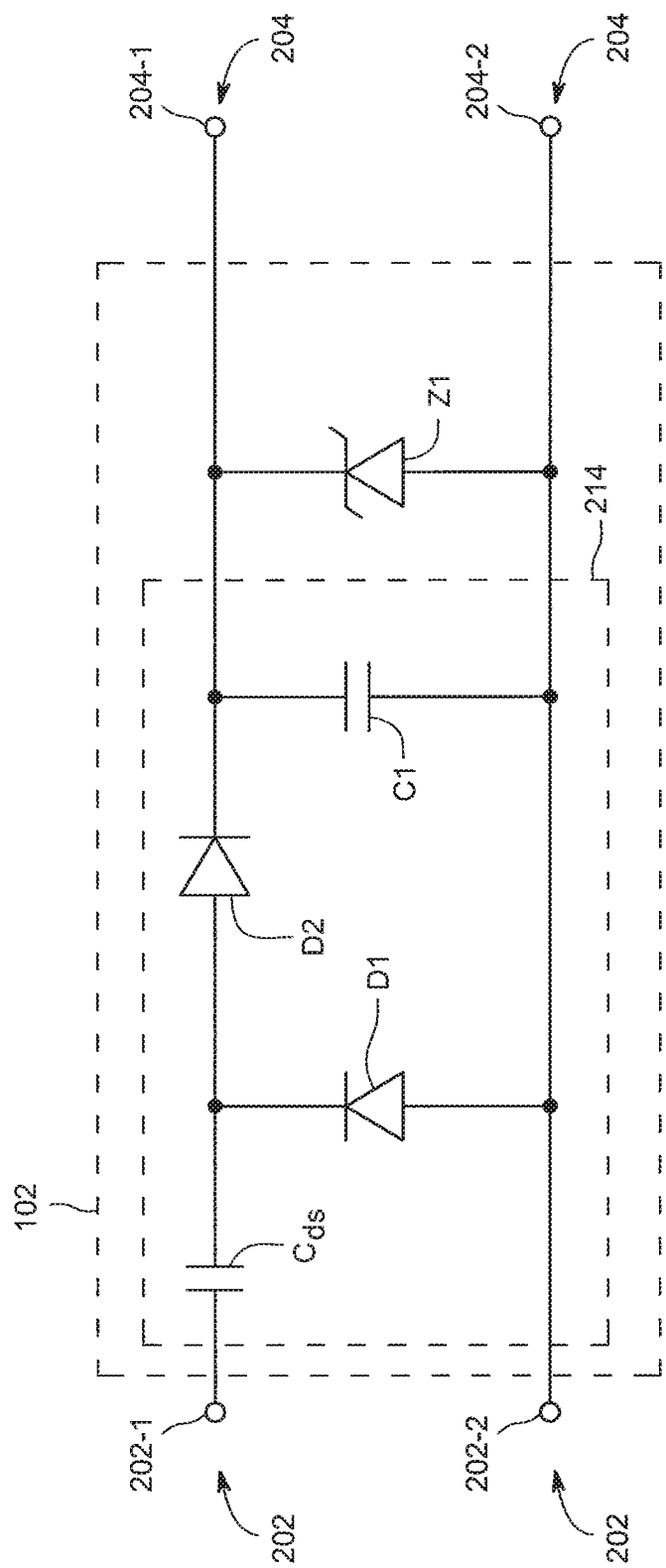
FIG. 2 is a block diagram of an auxiliary gate driver PSU in accordance with one or more embodiments of the present invention.

FIG. 2 is a block diagram of an auxiliary gate driver PSU 102 in accordance with one or more embodiments of the present invention. In the embodiment depicted in FIG. 2, the PSU 102 comprises capacitors Cds and C1, diodes D1 and D2, and a Zener diode Z1. The PSU 102 further comprises input terminals 202-1 and 202-2, collectively referred to as PSU input terminals 202, and output terminals 204-1 and 204-2, collectively referred to as PSU output terminals 204. The PSU input terminals 202-1 and 202-2 are coupled to the drain and source, respectively, of the corresponding switch 104, and the output terminals 204 are coupled to the corresponding isolated gate driver 114.

The capacitor Cds and the diode D1 are coupled in series across the PSU input terminals 202-1 and 202-2, where a first terminal of the capacitor Cds is coupled to the PSU input terminal 202-1, the second terminal of the capacitor Cds is coupled to the cathode of the diode D1, and the anode of the diode D1 is coupled to the input terminal 202-2.

The anode of the diode D2 is coupled to the cathode of the diode D1, and the cathode of the diode D2 is coupled to a first terminal of the capacitor C1. The capacitor C1 and the Zener diode Z1 are coupled in parallel across the output terminals 204 such that the first terminal of the capacitor C1 and the cathode terminal of the Zener diode Z1 are coupled to the output terminal 204-1, and the second terminal of the capacitor C1 and the anode of the Zener diode Z1 are coupled to the output terminal 204-2.

The capacitors Cds and C1 along with the diodes D1 and D2 form a charge pump circuit 214 that pumps up the voltage on the capacitor C1. The Zener diode Z1 acts as a Zener shunt regulator to dissipate excess power in order to regulate the output voltage from the charge pump circuit 214.

Figure 3:
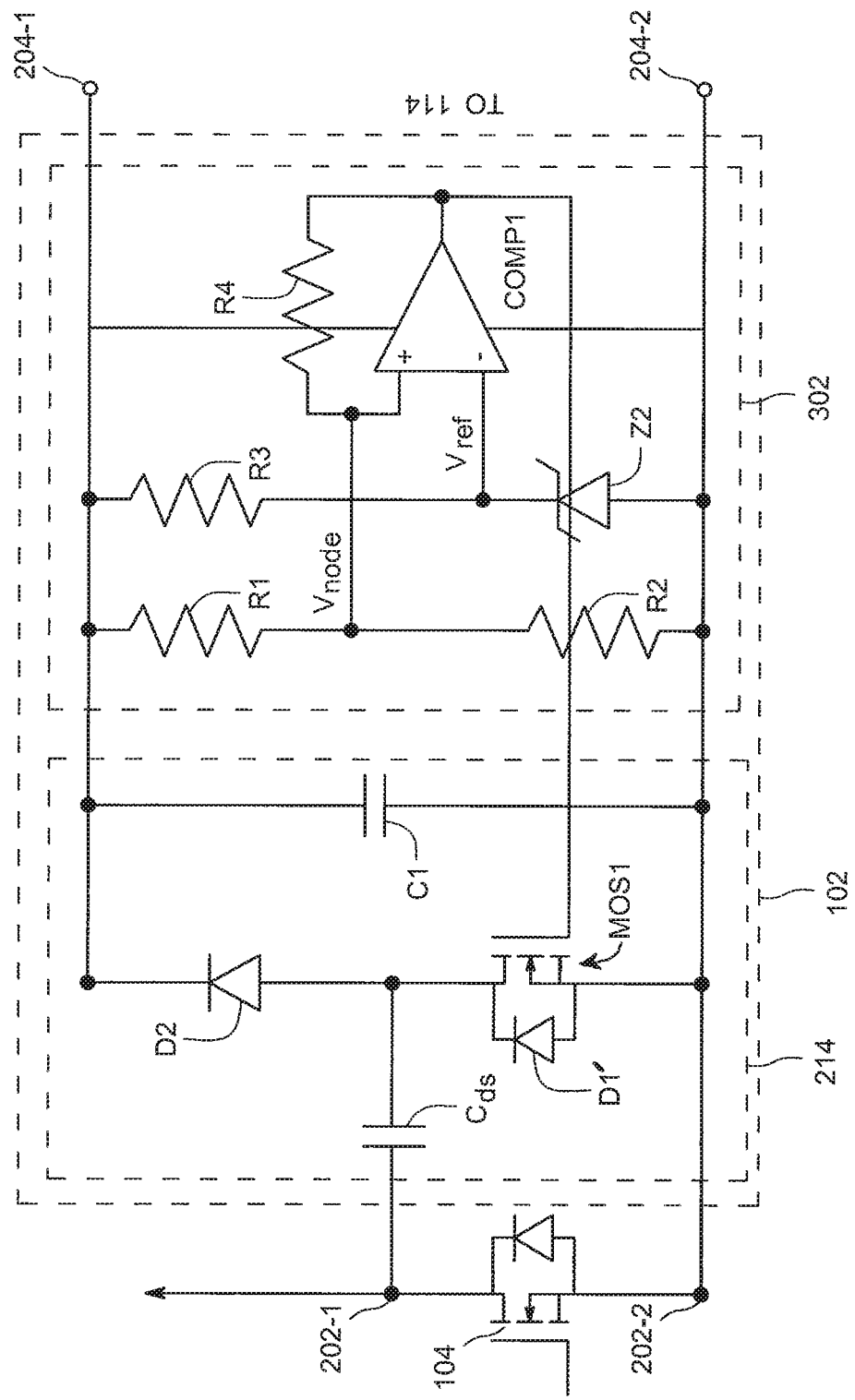
FIG. 3 is a block diagram of another embodiment of a gate driver PSU.

FIG. 3 is a block diagram of another embodiment of a gate driver PSU 102. In the embodiment depicted in FIG. 3, the diode D1 (shown in FIG. 2) has been replaced by a low-voltage MOSFET transistor MOS1.

The PSU 102 depicted in FIG. 3 comprises the capacitor Cds, the transistor MOS1, the diode D2, the capacitor C1, resistors R1, R2, R3 and R4, a Zener diode Z2, and a comparator COMP1. The capacitor Cds and the transistor MOS1 are coupled in series across the PSU input terminals 202-1 and 202-2, where the first terminal of the capacitor Cds is coupled to the PSU input terminal 202-1, the second terminal of the capacitor Cds is coupled to the drain of the transistor MOS1, and the source of the transistor MOS1 is coupled to the input terminal 202-2. The capacitor C1 is coupled across the cathode of the diode D2 and the source of the transistor MOS1.

The components Cds, MOS1, D2, and C1 form a charge pump circuit 214 of the PSU 102. When the transistor MOS1 is off (i.e., not conducting), its corresponding body diode D1' replaces the function of diode D1 of FIG. 2. When the transistor MOS1 is on (i.e., conducting), it provides a short to the input of the charge pump 214. The low-voltage MOSFET transistor MOS1 thus provides a method for turning the charge pump circuit 214 on or off.

The resistors R1 and R2 are coupled in series, and the series combination (i.e., a first branch) is coupled across the capacitor C1. The resistor R3 and the Zener diode Z2 are also coupled in a series combination (i.e., a second branch) across the capacitor C1, where a first terminal of the resistor R3 is coupled to a first terminal of the resistor R1, the second terminal of the resistor R3 is coupled to the cathode of the Zener diode Z2, and the anode of the Zener diode Z2 is coupled to a first terminal of the resistor R2. The second terminal of the resistor R2 is coupled to the second terminal of the resistor R1 and also to the non-inverting input of the comparator COMP1 and a first terminal of the resistor R4. The second terminal of the resistor R4 is coupled to the output of the comparator COMP1 and also to the gate of the transistor MOS1. The inverting input of the comparator COMP1 is coupled to the cathode of the Zener diode Z1.

The components R1, R2, R3, R4, Zener diode Z2, and the comparator COMP1 form a hysteretic voltage regulator circuit 302 that controls the MOSFET transistor MOS1 in order to regulate the output voltage of the charge pump 214. The top rail voltage from the charge pump circuit 214 (i.e., the voltage on the rail coupled to the PSU input port 202) is fed to both the first and the second branches (i.e., to the series combination of the resistors R1 and R2, and the series combination of the resistor R3 and the Zener diode Z2) of the hysteretic voltage regulator circuit 302. The resulting current through the resistor R3 results in a reference voltage $V_{ref}$ at the inverting input of the comparator COMP1. The reference voltage $V_{ref}$ is generally a low voltage, for example on the order of 3V.

The resistors R1 and R2 are chosen such that when the input voltage fed into the resistor R1 from the charge pump circuit 214 is at a desired voltage for the comparator COMP1 to switch, the voltage Vnode at the node between the resistors R1 and R2 is equal to the reference voltage $V_{ref}$. For example, for an input voltage of 8V fed into the resistor R1 and a reference voltage $V_{ref}$ of 3V, the resistors R1 and R2 are selected such that their resistances have a ratio of 5/3.

The resistor R4, coupled between the non-inverting input of the comparator COMP1 and the output of the comparator COMP1, provides positive feedback from the comparator COMP1 to the node between the resistors R1 and R2, creating hysteresis to provide a bi-stable comparator. The amount of hysteresis can be set by selecting the ratio of the resistor R4 to the resistors R1 and R2.

In some embodiments, the circuit components are selected to provide a hysteresis on the order of 100 mV around 8V. In such embodiments, when the voltage across the capacitor C1 is less than 8.1V, the output from the comparator COMP1 will be low and turn off the transistor MOS1, thereby providing the charge pump circuit functionality with the body diode of the transistor MOS1 providing the function of the diode D1 of FIG. 2. The charge pump then begins pumping up the voltage on the capacitor C1 when the voltage reaches 8.1V, the comparator COMP1 changes state to provide a high output that turns on the transistor MOS1, thereby turning off the charge pump function. Since charge is no longer being provided into the capacitor C1, the voltage across the capacitor C1 begins to diminish as a result of the external load that is being applied to it in the form of the gate driver 114. Once the voltage falls to 7.9V, the comparator COMP1 changes state to provide a low output, turning off the transistor MOS1 and thereby enabling the charge pump function once again. Through such operation, the output voltage from the gate driver PSU 102 is regulated at 8V+/−100 mV. In other embodiments, the output voltage from the gate driver PSU 102 may be regulated at another value and/or may have a different amount of hysteresis.

In other embodiments, other types of pulse-width modulation (PWM) control (e.g., fixed frequency, fixed on-time, fixed off-time, and the like) may be employed to control the overall on-to-off time ratio in place of the hysteretic control described above. By disabling the charge-pump function when not needed as a means of regulating the output voltage (as opposed to dissipating excess power with a Zener shunt regulator to regulate the output voltage, i.e., Zener diode Z1 as shown in FIG. 2), unnecessary power is not processed and energy efficiency of the circuit is increased.

Figure 4:
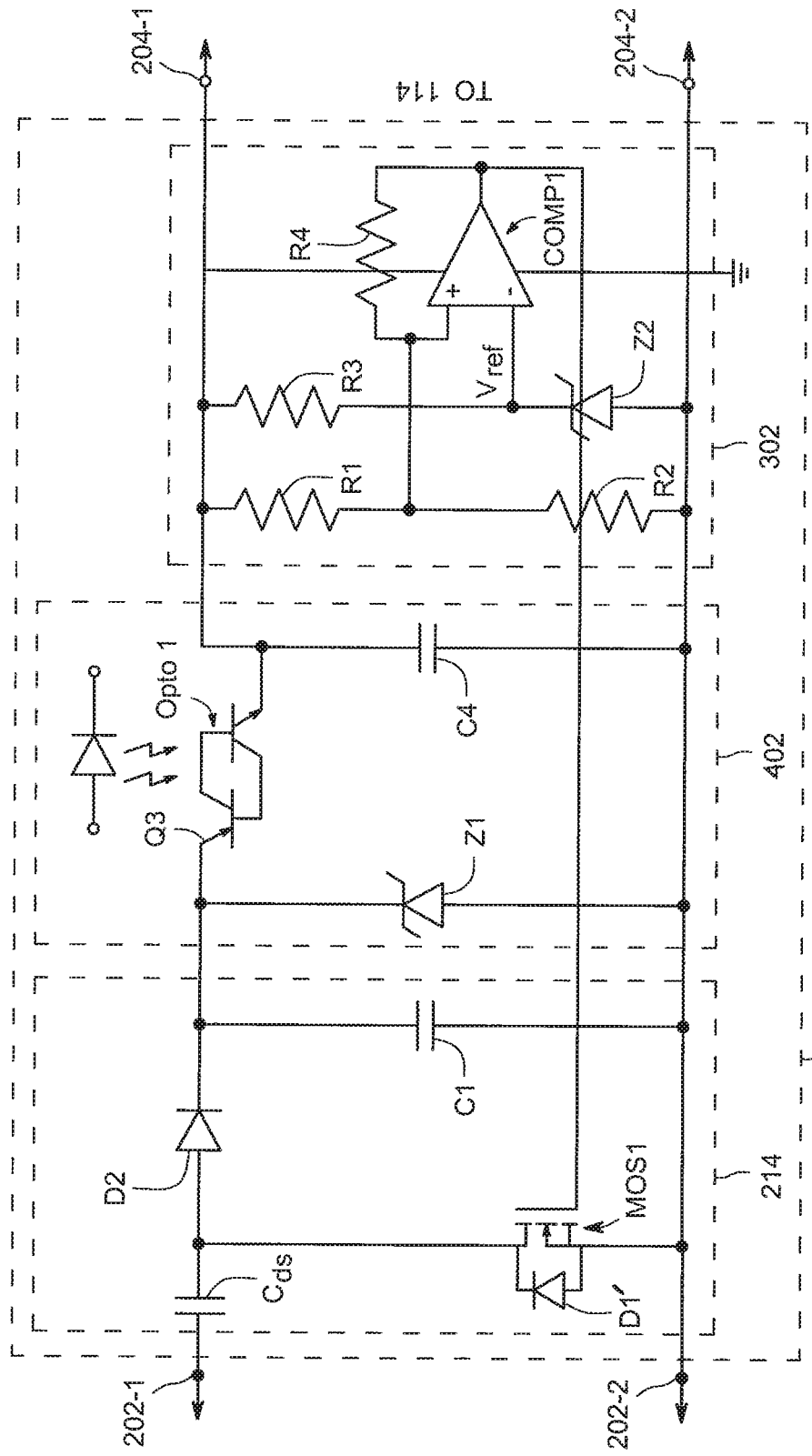
FIG. 4 is a is a block diagram of another embodiment of a gate driver PSU.

FIG. 4 is a block diagram of another embodiment of a gate driver PSU 102. In the embodiment depicted in FIG. 4, the gate driver PSU 102 comprises a bootstrap start-up circuit 402 coupled between the charge pump circuit 214 and the hysteretic voltage regulator circuit 302.

The bootstrap start-up circuit 402 comprises the Zener diode Z1, a bipolar junction transistor (BJT) switch Q3, an opto-isolator Opto1, and a capacitor C4. The Zener diode D3 is coupled across the capacitor C1 such that the cathode of the Zener diode D3 is coupled to the first terminal of the capacitor C1 and the anode of the Zener diode Z1 is coupled to the second terminal of the capacitor C1. The emitter of the switch Q3 is coupled to the cathode of the Zener diode Z1, the collector of the switch Q3 is coupled to the base of the opto-isolator transistor, and the base terminal of the switch Q3 is coupled to collector of the opto-isolator transistor. A first terminal of the capacitor C4 is coupled to the emitter of the opto-isolator transistor and to the output terminal 204-1; the second terminal of the capacitor C4 is coupled to the output terminal 204-2.

The components Z1, Q3, Opto1, and C4 (i.e., the bootstrap start-up circuit 402) have been added with respect to the embodiment depicted in FIG. 3 to provide initial activation of the gate driver PSU 102 as described below. The bootstrap start-up circuit 402 allows for the charge pump circuit 214 to harness enough energy from a low-frequency excitation, e.g., the mains line frequency, in order to pre-charge the reservoir capacitor C1 with sufficient energy to allow the start-up of the corresponding isolated gate driver 114 with the view that once switching activity is started, the charge pump circuit 214 will sustain the necessary power supply. The coordination function of the bootstrap start-up circuit 402 allows multiple isolated gate drivers 114 to all be started at the same time.

In some embodiments, the power converter 100 is a two-stage photovoltaic (PV) DC:AC inverter (e.g., a string inverter, a central inverter, or a microinverter) having a first stage boost converter to perform MPPT, followed by a second stage inverter to convert the high-voltage DC into AC commensurate with the mains grid. In such embodiments, an isolated gate driver 114 may be coupled to each AC-side switch (i.e., one isolated gate driver 114 for each switch) for controlling the switch, where each isolated gate driver 114 receives power from a corresponding to PSU 102 that is coupled across the corresponding switch. In one or more of such embodiments, the output of the power converter 100 is coupled to an AC grid (e.g., a commercial power grid). During daylight hours when the PV module or modules are receiving sunlight and the power converter 100 is operating, the AC-side switches are switching a square wave on the order of several hundreds of volts and generally a few hundred kilohertz. However, during the evening when the PV module or modules are no longer receiving sunlight, the power converter 100 shuts down.

As a result of being connected to the AC grid, an AC voltage is applied across the AC-side switches, where the AC voltage applied is on the order of a few hundreds of volts with a frequency based on the natural line frequency of the AC grid (e.g., 50 Hz or 60 Hz). For the gate driver PSU 102 depicted in FIGS. 2 and 3, the charge pump circuit 214 would still be able to pump up and generate a voltage on the output reservoir capacitor C1 however, the power would be much less than during normal operation and the charge pump circuit 214 would only be able to provide on the order of a few microamps (μA) of current. In some embodiments, the isolated gate driver 114 may draw a quiescent current on the order of 3 mA.

The addition of the bootstrap start-up circuit 402 allows start-up from a low-frequency excitation such as from the commercial grid line frequency. The switch Q3 and the opto-isolator Opto1 form a silicon controlled rectifier (SCR) (or thyristor) latch that, when off, isolates the hysteretic voltage regulator circuit 302 from the charge pump circuit 214. The charge pump circuit 214, although excited at a lower frequency than during normal operation, works to charge the capacitor C1 up to the breakdown voltage of the Zener diode Z1, thereby providing a regulated supply on the capacitor C1.

Upon activation of the power converter 100 when the sun rises, the power converter 100 drives the diode-side of the opto-isolator Opto1, thereby turning on the opto-isolator transistor. Once the LED is activated, the combination of the switch Q3 and the opto-isolator Opto1 is activated and connects the capacitor C4 across both the capacitor C1 and the Zener diode Z1. Once the capacitor C4 is connected across the capacitor C1, the voltage on the reservoir capacitor C1 is fed to the hysteretic voltage regulator circuit 302 and also to the supply of the isolated gate driver 114, thus activating both the isolated gate driver 114 and the hysteretic voltage regulator circuit 302. The hysteretic voltage regulator circuit 302 can then begin regulating the output voltage of the gate driver PSU 102 and a supply current can now be fed to the isolated gate driver 114. By sufficiently sizing the capacitor C1, for example on the order of 100 uF, enough energy can be maintained in the capacitor C1 to start up the gate driver PSU 102 and bring the circuit up to its normal operating voltage and frequency. Additionally, the opto-isolator Opto1 allows coordinated start-up of multiple isolated gate drivers 114.

Figure 5:
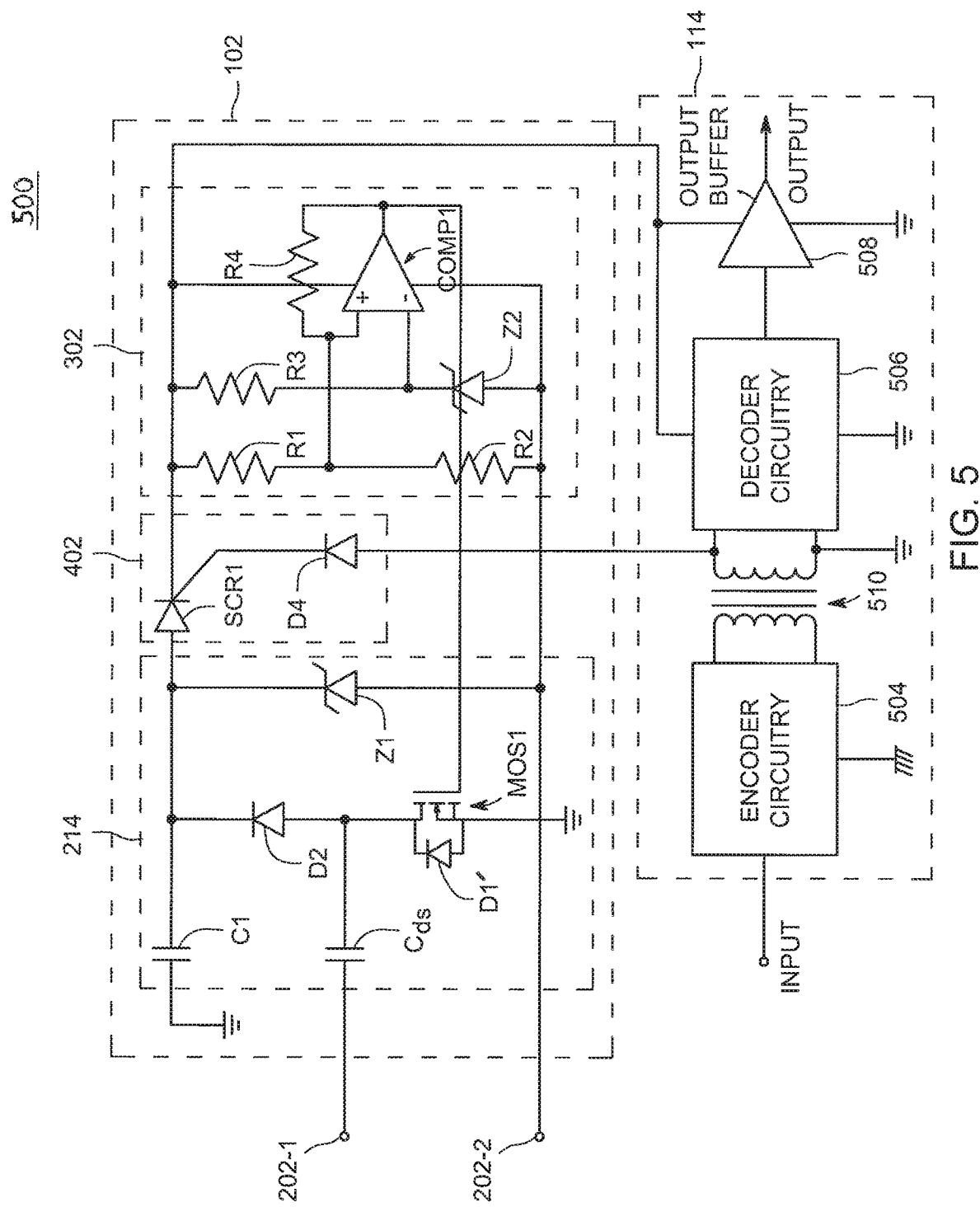
FIG. 5 is a functional block diagram of an integrated isolated gate driver/gate driver PSU in accordance with one or more embodiments of the present invention.

FIG. 5 is a functional block diagram of an integrated isolated gate driver/gate driver PSU 500 in accordance with one or more embodiments of the present invention. The integrated isolated gate driver/gate driver PSU 500 integrates both an isolated gate driver 114 as well as a gate driver PSU 102 onto a single integrated circuit (IC) chip. The embodiment of the gate driver PSU 102 depicted in FIG. 5 comprises a bootstrap start-up circuit 402 coupled between the charge pump circuit 214 and the hysteretic voltage regulator circuit 302. The bootstrap circuit 402 comprises a thyristor SCR1 and a diode D4; the anode of the thyristor SCR1 is coupled to the cathode of the Zener diode Z1, the cathode of the thyristor SCR1 is coupled to the first terminal of the resistor R1, and the cathode of the diode D4 is coupled to the gate of the thyristor SCR1.

The integrated isolated gate driver/gate driver PSU 500 comprises one embodiment of the isolated gate driver 114. The isolated gate driver 114 comprises encoder circuitry 504 coupled across the primary winding of a transformer 510, decoder circuitry 506 coupled across the secondary winding of the transformer 510, and an output buffer 508 coupled to the decoder circuitry 506. Additionally, the anode of the diode D4 is coupled to the secondary winding of the transformer 510.

The output from the isolated gate driver 502 mimics the state of the input to the isolated gate driver 502 and is galvanically electrically isolated from the input. Although the encoder circuitry 504 and the decoder circuitry 506/output buffer 508 each require a power supply, only the power supply for the decoder circuitry 506/output buffer 508 is shown in FIG. 5 and one skilled in the art would understand that another analogous power supply would be needed to power the encoder circuitry 504.

In some embodiments, the circuitry D2, MOS1, Z1, SCR1, D4, R1, R2, R3, Z2, R4 and COMP1 may be incorporated into the decoder circuitry block or into the circuitry on the secondary side of the isolated gate driver chip, where the capacitors C1 (a power supply bypass capacitor) and Cds are external to the IC.

As previously described, the components C1, Cds, D2, MOS1, and Z1 form an embodiment of the charge pump circuit 214, and the components R1, R2, R3, Z2, R4 and COMP1 form an embodiment of the hysteretic voltage regulator circuit 302. Further, the components SCR1 and D4 form an embodiment of the bootstrap start-up circuit 402. As such, the charge pump circuit 214, bootstrap start-up circuit 402, and hysteretic voltage regulator circuit 302 may be integrated into an industry-standard isolated gate driver IC to provide a self-powered gate charger function as part of the isolated gate driver IC.

The integrated isolated gate driver/gate driver PSU 500 does not require an external power supply to supply power to the gate driver decoder circuitry 506 and the output buffer 508 stages as it would be able to derive the needed power itself.

During operation, the encoder circuitry 504 couples a very high frequency to the primary winding of the transformer 5109, e.g., generally within the radio frequency range (for example tens to hundreds of megahertz (MHz)). As a result of the voltage generated across the transformer secondary winding, a current flow through D4 is generated and triggers the thyristor SCR1 to turn on, thereby connecting the voltage on the reservoir capacitor C1 through to the hysteretic voltage regulator circuit 302 and to the decoder circuitry 506 and output buffer 508. As such, the decoder circuitry 506 is powered up and can analyze the received signal from the transformer secondary winding to identify a valid signature frequency sent from the encoder circuitry 504. If the signal received is valid, the overall start-up process begins to bring the entire circuit up and running. If the signal received is not valid, for example if the thyristor SCR1 was prematurely tripped by noise, the decoder circuitry 506 and the hysteretic voltage regulator circuit 302 dissipate the stored energy in the capacitor C1, collapsing the voltage on the capacitor C1 to the point where the thyristor SCR1 turns off and resets the function.

Although the circuits 214, 402, and 302 can provide functionality for powering the isolated gate driver 114, they do not detract from being able to use the isolated gate driver 114 with an external auxiliary power supply if desired.

Figure 6:
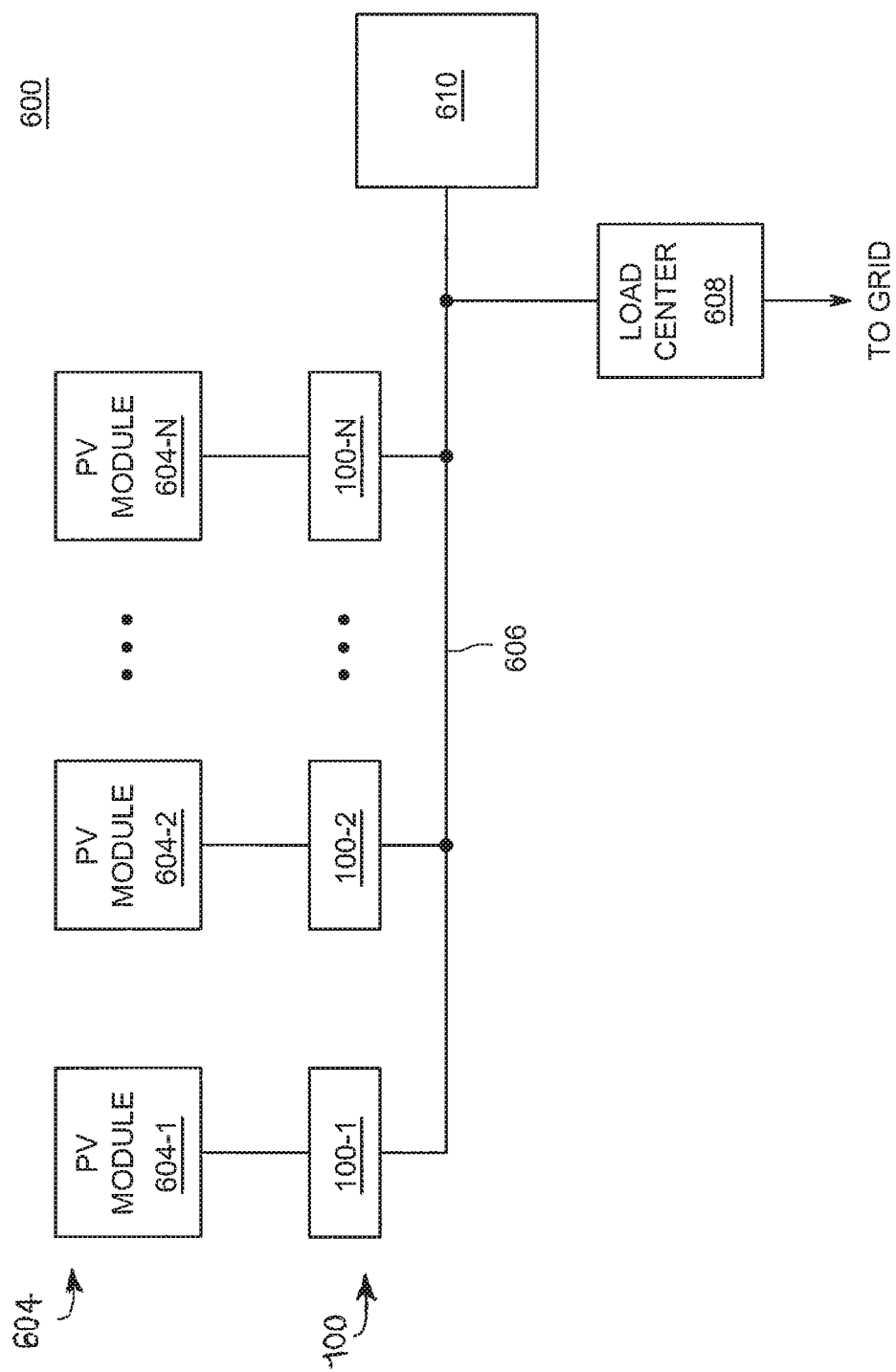
FIG. 6 is a block diagram of a system for distributed generation (DG) in accordance with one or more embodiments of the present invention.

FIG. 6 is a block diagram of a system 600 for distributed generation (DG) in accordance with one or more embodiments of the present invention. This diagram only portrays one variation of the myriad of possible system configurations. The present invention can function in a variety of distributed power generation environments and systems.

The system 600 comprises a plurality of power converters 100$_1$, 100$_2$ . . . 100$_n$, collectively referred to as power converters 100, a plurality of PV modules 604$_1$, 604$_2$ . . . 604$_n$, collectively referred to as PV modules 604, an AC bus 606, a load center 608, and a system control module 610.

Each power converter 100$_1$, 100$_2$ . . . 100$_n$ is coupled to a PV module 604$_1$, 604$_2$ . . . 604$_n$, respectively, in a one-to-one correspondence and converts DC power from the corresponding PV module 604 to AC power. The power converters 100 are coupled to the AC bus 606, which in turn is coupled to the system control module 610 and the load center 608. The system control module 610 (e.g., a gateway) is capable of communicating with the power converters 100, for example for issuing command and control signals to the power converters 100 and/or for receiving information from the power converters 100. In some embodiments, the system control module 610 may be a gateway for receiving information from and/or sending information to another device (such as a remote master controller), for example via the Internet. In such embodiments, the system control module 610 may communicate information pertaining to the power converters 100 (e.g., performance data) to a remote master controller, and/or communicate data from the remote master controller (e.g., control commands) to one or more of the power converters 100.

The load center 608 houses connections between incoming power lines from a power grid distribution system (such as a commercial grid) and the AC bus 606.

The power converters 100 convert DC power from the PV modules 604 into AC power that is power grid compliant and couple the generated AC power to the grid via the load center 608. Additionally or alternatively, the generated power may be distributed for use via the load center 608 to one or more appliances, and/or the generated energy may be stored for later use, for example using batteries, heated water, hydro pumping, $H_2O$-to-hydrogen conversion, or the like.

In some other embodiments, other DC sources may be used in addition to or in place of the PV modules 604 (e.g., batteries, other types of renewable energy sources such as wind, hydro, or the like).

In certain embodiments, the system 600 comprises one or more energy storage mediums (such as batteries) coupled to one or more power converters 100 that convert AC power received from the AC bus 606 to DC output that is stored in the energy storage mediums.

In some alternative embodiments, the power converters 100 are DC:DC converters that are coupled to a DC distribution bus (rather than the AC bus 606) for coupling generated DC power from the power converters 100 to one or more DC devices and/or a DC distribution grid. In some of such embodiments, one or more energy storage mediums (such as batteries) are coupled to one or more power converters 100 that convert DC power received from the DC bus to a DC output that is stored in the energy storage mediums.

Each of the power converters 100 comprises one or more transistors (such as the switches 104), each transistor driven by a corresponding isolated gate driver (such as the isolated gate driver 114). In accordance with one or more embodiments of the present invention, for each switch/isolated gate driver, an auxiliary gate driver PSU 102 is coupled to the switch/isolated gate driver for powering the isolated gate driver as described herein.

While the foregoing is directed to embodiments of the present invention, other and further embodiments of the invention may be devised without departing from the basic scope thereof, and the scope thereof is determined by the claims that follow.

The invention claimed is:

1. An apparatus for powering a power converter isolated gate driver, comprising:
   a gate driver power supply unit (PSU), coupled to a transistor and to an isolated gate driver that couples control signals to the transistor, for (i) harnessing energy from commutation action across the transistor, and (ii) using the harnessed energy to power the isolated gate driver.

2. The apparatus of claim 1, wherein the gate driver PSU comprises a charge pump circuit, driven by an AC voltage across the transistor, for harnessing the energy.

3. The apparatus of claim 2, wherein the gate driver PSU further comprises a voltage regulator circuit, coupled to the charge pump circuit, for regulating an output voltage from the charge pump circuit.

4. The apparatus of claim 3, wherein the voltage regulator circuit is pulse-width modulated controlled.

5. The apparatus of claim 3, wherein the voltage regulator circuit disables the charge pump to regulate the output voltage.

6. The apparatus of claim 3, wherein the voltage regulator circuit uses hysteresis in regulating the output voltage.

7. The apparatus of claim 3, wherein the gate driver PSU further comprises a bootstrap start-up circuit, coupled to the charge pump circuit and to the voltage regulator circuit, for initially activating the gate driver PSU.

8. The apparatus of claim 7, wherein the bootstrap start-up circuit comprises a thyristor latch that, prior to initial activation of the transistor, isolates the voltage regulator circuit from the charge pump circuit for the charge pump circuit to pre-charge to a regulated amount.

9. A power conversion system for powering an isolated gate driver, comprising:
   a power converter comprising at least one transistor;
   at least one isolated gate driver coupled to the at least one transistor for coupling control signals to the at least one transistor, wherein the at least one isolated gate driver and the at least one transistor are coupled in a one-to-one configuration; and
   for each transistor of the at least one transistor, a gate driver power supply unit (PSU) coupled to the transistor and to the corresponding isolated gate driver for (i) harnessing energy from commutation action across the transistor, and (ii) using the harnessed energy to power the corresponding isolated gate driver.

10. The power conversion system of claim 9, wherein the gate driver PSU comprises a charge pump circuit, driven by an AC voltage across the transistor, for harnessing the energy.

11. The power conversion system of claim 10, wherein the gate driver PSU further comprises a voltage regulator circuit, coupled to the charge pump circuit, for regulating an output voltage from the charge pump circuit.

12. The power conversion system of claim 11, wherein the voltage regulator circuit is pulse-width modulated controlled.

13. The power conversion system of claim 11, wherein the voltage regulator circuit disables the charge pump to regulate the output voltage.

14. The power conversion system of claim 11, wherein the voltage regulator circuit uses hysteresis in regulating the output voltage.

15. The power conversion system of claim 11, wherein the gate driver PSU further comprises a bootstrap start-up circuit, coupled to the charge pump circuit and to the voltage regulator circuit, for initially activating the gate driver PSU.

16. The power conversion system of claim 15, wherein the bootstrap start-up circuit comprises a thyristor latch that, prior to initial activation of the transistor, isolates the voltage regulator circuit from the charge pump circuit for the charge pump circuit to pre-charge to a regulated amount.

17. The power conversion system of claim 9, wherein the power converter is a DC: DC converter.

18. The power conversion system of claim 9, wherein the power converter is a DC:AC converter.

19. The power conversion system of claim 9, wherein the power converter is an AC: DC converter.

20. The power conversion system of claim 9, wherein the power converter is a bi-directional converter.

* * * * *